US009356166B2

(12) United States Patent
Stolin et al.

(10) Patent No.: US 9,356,166 B2
(45) Date of Patent: May 31, 2016

(54) COOLED OPTICAL LIGHT GUIDE FOR LOW-LEVEL LIGHT DETECTORS AND METHOD OF TEMPERATURE STABILIZATION FOR IMAGING DETECTORS

(71) Applicants: Alexander Stolin, Morgantown, WV (US); Stanislaw Majewski, Morgantown, WV (US); Raymond Raylman, Morgantown, WV (US)

(72) Inventors: Alexander Stolin, Morgantown, WV (US); Stanislaw Majewski, Morgantown, WV (US); Raymond Raylman, Morgantown, WV (US)

(73) Assignee: West Virginia University, Morgantown, WV (US)

( * ) Notice: Subject to any disclaimer, the term of this patent is extended or adjusted under 35 U.S.C. 154(b) by 159 days.

(21) Appl. No.: 13/904,183

(22) Filed: May 29, 2013

(65) Prior Publication Data
US 2013/0334408 A1    Dec. 19, 2013

Related U.S. Application Data

(60) Provisional application No. 61/654,268, filed on Jun. 1, 2012.

(51) Int. Cl.
| | |
|---|---|
| *H01L 31/024* | (2014.01) |
| *G01J 1/04* | (2006.01) |
| *G01T 1/20* | (2006.01) |
| *G01J 1/02* | (2006.01) |

(52) U.S. Cl.
CPC ............. *H01L 31/024* (2013.01); *G01J 1/0252* (2013.01); *G01J 1/0425* (2013.01); *G01T 1/2018* (2013.01)

(58) Field of Classification Search
CPC .................................................... H01L 31/024
USPC ......................................... 250/370.15, 227.24
See application file for complete search history.

(56) References Cited

U.S. PATENT DOCUMENTS

| 2009/0253957 A1* | 10/2009 | Yasunaga .................... 600/109 |
| 2010/0295144 A1* | 11/2010 | Jackson et al. ................ 257/443 |
| 2011/0291010 A1* | 12/2011 | Katane et al. ................. 250/310 |

FOREIGN PATENT DOCUMENTS

JP    2008145427 A  *  6/2008

OTHER PUBLICATIONS

Bondarenko, G. et al., Limited Geiger-Mode Silicon Photodiode with Very High Gain, Nuclear Physics B Proceeding Supplements, 1998, 347-352, 61B, Elsevier Science B.V.

(Continued)

*Primary Examiner* — David Porta
*Assistant Examiner* — Abra Fein
(74) *Attorney, Agent, or Firm* — Buchanan Ingersoll & Rooney PC; Craig G. Cochenour

(57) ABSTRACT

A cooled optical light guide is provided having a conduit having a translucent top and a translucent bottom wherein at least a portion of the translucent top of the conduit is in alignment above at least a portion of the translucent bottom of the conduit. A fluid medium that is preferably cooled flows through the conduit. The optical light guide is placed between a scintillator array and an array detector. The temperature of the light that is emitted by the scintillator array is stabilized, and preferably cooled, as it passes through the translucent bottom of the conduit and through the translucent top of the conduit for detection by the array detector. A method of temperature stabilization for photomultiplier based detectors is disclosed.

27 Claims, 13 Drawing Sheets

(56) References Cited

OTHER PUBLICATIONS

Golovin, V. et al., Novel Type of Avalanche Photodetector with Geiger Mode Operation, Nuclear Instruments & Method in Physics Research, 2004, 560-564, Section A, 518, Elsevier B.V.

Yamamoto, K. et al., Development of MultiPixel Photon Counter (MPPC), IEEE Nuclear Science Symposium Conference Record, 2006, 1094-1097, N30-102, IEEE.

Proffitt, J. et al., Implementation of a High-Rate USB Data Acquisition System for PET and SPECT Imaging, IEEE Nuclear Science Symposium Conference Record, 2006, 3063-3067, M14-123, IEEE.

Otte, N. et al., The SiPM—A New Photon Detector for PET, Nuclear Physics B Proceeding Supplements, 2006, 417-420, 150, Elsevier B.V.

Piemonte, C. et al., Recent Developments on Silicon Photomultipliers Produced at FBK-irst, IEEE Nuclear Science Symposium Conference Record, 2007, 2089-2092, N41-2, IEEE.

Otono, H. et al., Study of MPPC at Liquid Nitrogen Temperature, Proceedings of Science, 2007, 2-6, International Workshop on New Photon-Detectors.

Burr, K.C. et al., Scintillation Detection Using 3 mm × 3 mm Silicon Photomultipliers, IEEE Nuclear Science Symposium Conference Record, 2007, 975-982, N18-2, IEEE.

Ramilli, M. et al., Characterization of SiPM: Temperature Dependencies, Nuclear Science Symposium Conference Record, 2008, 2467-2470, IEEE Transactions on Nuclear Science.

Petasecca, M. et al., Thermal and Electrical Characterization of Silicon Photomultiplier, IEEE Transactions on Nuclear Science, 2008, 1686-1690, vol. 55, IEEE.

Osovizky, A. et al., Scintillation Light Readout Using Silicon Photomultiplier—Review and Experimental Results, IEEE Nuclear Science Symposium Conference Record, 2008, 2482-2483, N30-358, IEEE.

Mao, R. et al., Optical and Scintillation Properties of Inorganic Scintillators in High Energy Physics, 2008, 2425-2431, vol. 55, No. 4, IEEE.

\* cited by examiner (a)

(b)

(c)

COOLED OPTICAL LIGHT GUIDE FOR LOW-LEVEL LIGHT DETECTORS AND METHOD OF TEMPERATURE STABILIZATION FOR IMAGING DETECTORS

CROSS-REFERENCE TO RELATED APPLICATIONS

This utility patent application claims the benefit of U.S. Provisional Patent Application Ser. No. 61/654,268, filed on Jun. 1, 2012. The entire contents of U.S. Provisional Patent Application Ser. No. 61/654,268 is incorporated by reference into this utility patent application as if fully written herein.

BACKGROUND OF THE INVENTION

1. Field of the Invention

The present invention provides a cooled optical light guide suitable for placement between a scintillator array and an array detector. A method of temperature stabilization for photomultiplier based detectors is disclosed.

2. Description of the Background Art

The main drawback of silicon-based photomultiplier (SiPM) devices is variation of detector performance with even small temperature fluctuations.

Rapid development in the field of silicon photomultipliers (SiPM) solidified their position as replacements for standard vacuum photomultiplier tubes (PMTs). Silicon-based devices possess equally high amplification gain, but hold strong advantage in compactness, insensitivity to magnetic fields, lower bias voltages and potentially lower costs, making them a viable alternative to PMT technology [1-5]. Certain limitations still prevent SiPMs from completely replacing vacuum PMTs. One of the limitations of the newly developed silicon photomultiplier technology is low signal-to-noise ratio (SNR) compared to the well-established vacuum photomultipliers. Lower SNR results in poorer energy resolution and fluctuations in the center of gravity (COG) calculations of the position of the scintillation event in the light sharing systems, which results in errors in event localization. It has been shown by multiple research groups [6-8] that SNR in SiPMs improves substantially with lowering the temperature of the light sensor. In addition, gain of SiPMs depends on the sensor temperature, in some cases quite dramatically [9,10]. While bias voltage adjustment mitigates the issue of drifting amplification gain, it does not address an increase in noise with increased temperature. Medical imaging applications, positron emission tomography (PET) and single photoemission computed tomography (SPECT), for example, can benefit greatly from improved signal-to-noise ratio, due to limited light yield of scintillation materials. It is therefore highly advantageous to lower and stabilize the SiPM sensors temperature in order to improve the operation of the SiPM-based detection modules.

Thermoelectrically cooled single module SiPM devices are being offered by commercial vendors, while the cooling of multi-pixel arrays of SiPMs is an active area of research. Several cooling methods are being considered and implemented. The main challenge is to deliver the cooling power as close as possible to the SiPM arrays and in uniform and stable manner. Piped distributed cooling liquids or gas, or blowing cool air present their own technical challenges with the uncertain outcomes as to the uniformity and efficiency of delivery of the cooling power.

SUMMARY OF THE INVENTION

The present invention provides a device comprising an imaging detection module having a scintillator array capable of emitting light and an array detector capable of detecting the emitted light from the scintillator array; an optical light guide that is in juxtaposition to and disposed between the scintillator array and the array detector, wherein the optical light guide comprising a conduit having a first open end, a second open end, and a middle section, wherein the second open end of the conduit is located opposite of the first open end of the conduit, and wherein the middle section of the conduit is disposed between and in communication with the first open end of the conduit and the second open end of the conduit, and wherein the conduit has a translucent or transparent top extending for at least a portion of the length of the conduit forming a first optical window, and wherein the conduit has a translucent or transparent bottom extending for at least a portion of the length of the conduit forming a second optical window, and wherein a passageway is established between the first open end of the conduit, the middle section of the conduit, and the second open end of the conduit, and wherein at least a portion of the translucent or transparent top of the conduit is in alignment above at least a portion of the translucent or transparent bottom of the conduit such that the light emitted by the scintillator array is capable of passing through the second optical window, the passageway of the middle section of the conduit, and the first optical window for detection by the array detector; a fluid medium circulation conduit having (i) a first tube member having a first open end, a second open end, and a middle section, wherein the second open end of the first tube member is located opposite of the first open end of the first tube member, and wherein the middle section of the first tube member is disposed between and in communication with the first open end of the first tube member and the second open end of the first tube member, and wherein the first open end of the first tube member is in sealed engagement and communication with the first open end of the conduit of the optical light guide, and wherein the second open end of the first tube member is in sealed engagement and communication with the second open end of the conduit of the optical light for forming a fluid medium circuit passageway between the conduit of the optical light guide and the first tube member of the fluid medium circulation conduit; and at least one temperature control element that is in communication with the fluid medium circuit passageway.

Another embodiment of this invention provides the device, as described herein, wherein the fluid medium circuit passageway includes at least one fluid medium movement device for effecting the movement of a fluid medium through the conduit of the optical light guide and the fluid medium circulation conduit. Preferably, the fluid medium movement device is a pump that is capable of adjusting the rate and volume of the fluid medium passing through the fluid medium circuit passageway.

In another embodiment of the device of this invention as described herein, the scintillator array is a LYSO crystal array such as for example but not limited to a cerium doped lutetium yttrium orthosilicate and the array detector is a silicon photomultiplier (SiPM).

Another embodiment of the device of this invention as described herein includes wherein the temperature control element is capable of stabilizing the temperature of the fluid medium passing (i.e flowing, moving) through the fluid medium circuit passageway which also includes the passageway of the conduit of the optical light guide, and preferably, the temperature control element is capable of lowering the temperature of the fluid medium passing (i.e. flowing, moving) through the fluid medium circuit passageway which also includes the passageway of the conduit of the optical light guide. More preferably, the device of this invention is capable of stabilizing the temperature of the detected light emitted from said scintillator array. Most preferably, the device of the present invention as described herein, is capable of cooling the emitted light of the scintillator array before it is detected by the array detector with the result of increasing a signal to noise ratio performance of the scintillator array and the array detector.

In another embodiment of this invention as described herein, the fluid medium employed in the present device is preferably a mixture of ethylene glycol and water, and more preferably the ratio of ethylene glycol to water is 1:1.

Another embodiment of the device of the present invention as described herein comprises a reservoir hat is in sealed engagement and communication with the fluid medium circuit passageway.

The device of this invention may include one or more ports located along and in communication with the fluid medium circuit passageway, wherein the ports may be entered for adding or replenishing the fluid medium or removing spent fluid medium.

In another embodiment of this invention, an optical light guide is provided comprising a conduit having a first open end, a second open end, and a middle section, wherein the second open end of the conduit is located opposite of the first open end of the conduit, and wherein the middle section of the conduit is disposed between and in communication with the first open end of the conduit and the second open end of the conduit, and wherein the conduit has a translucent or transparent top extending for at least a portion of the length of the conduit forming a first optical window, and wherein the conduit has a translucent or transparent bottom extending for at least a portion of the length of the conduit forming a second optical window, and wherein a passageway is established between the first open end of the conduit, the middle section of the conduit, and the second open end of the conduit, and wherein at least a portion of the translucent or transparent top of the conduit is in alignment above at least a portion of the translucent or transparent bottom of the conduit.

In another embodiment of the optical light guide of this invention, as described herein, a scintillator array is disposed in juxtaposition to the second optical window of the optical light guide and wherein an array detector is disposed in juxtaposition to the first optical window of the optical light guide.

Another embodiment of the optical light guide of the present invention, as described herein, includes wherein the the passageway of the optical light guide is capable of receiving an influx of a temperature controlled fluid medium at the first open end of the conduit, and wherein the temperature controlled fluid medium is capable of passing through the passageway and forming an effluent stream of the temperature controlled fluid medium at the second open end of the conduit. Alternatively, the passageway of the light guide of the present invention is capable of receiving an influx of a temperature controlled fluid medium at the second open end of the conduit, and wherein the temperature controlled fluid medium is capable of passing through the passageway and forming an effluent stream of temperature controlled fluid medium at the first open end of the conduit.

Another embodiment of the optical light guide of the present invention, as described herein, includes providing a fluid medium circulation conduit comprising (i) a first tube member having a first open end, a second open end, and a middle section, wherein the second open end of the first tube member is located opposite of the first open end of the first tube member, and wherein the middle section of the first tube member is disposed between and in communication with the first open end of the first tube member and the second open end of the first tube member, and wherein the first open end of the first tube member is in sealed engagement and communication with the first open end of the conduit of the optical light guide, and wherein the second open end of the first tube member is in sealed engagement and communication with the second open end of the conduit of the optical light for forming a fluid medium circuit passageway between the conduit of the optical light guide and the first tube member of the fluid medium circulation conduit. Preferably, the optical light guide includes at least one temperature control element that is in communication with said fluid medium circuit passageway. Another embodiment includes wherein the optical light guide of the present invention includes wherein the fluid medium circuit passageway includes at least one fluid medium movement device for effecting the movement (i.e. flow) of a fluid medium through the conduit of the optical light guide and the fluid medium circulation conduit. Preferably, the fluid medium movement device is a pump or other such apparatus that is capable of adjusting the rate and volume of the fluid medium passing through the fluid medium circuit passageway.

In yet another embodiment, the optical light guide of the present invention, as described herein, includes wherein the temperature control element is capable of stabilizing, and preferably lowering, the temperature of the fluid medium passing through the fluid medium circuit passageway.

Another embodiment of the optical light guide of the present invention, as described herein, includes wherein the optical light guide is in juxtaposition to and disposed between a scintillator array and an array detector.

In another embodiment of this invention, a method of temperature stabilization for photomultiplier-based devices is disclosed. This method comprises providing a photomultiplier device comprising an imaging detection module having a scintillator array capable of emitting light and an array detector capable of detecting the emitted light from the scintillator array; providing an optical light guide that is in juxtaposition to and disposed between the scintillator array and the array detector, wherein the optical light guide comprising a conduit having a first open end, a second open end, and a middle section, wherein the second open end of the conduit is located opposite of the first open end of the conduit, and wherein the middle section of the conduit is disposed between and in communication with the first open end of the conduit and the second open end of the conduit, and wherein the conduit has a translucent or transparent top extending for at least a portion of the length of the conduit forming a first optical window, and wherein the conduit has a translucent or transparent bottom extending for at least a portion of the length of the conduit forming a second optical window, and wherein a passageway is established between the first open end of the conduit, the middle section of the conduit, and the second open end of the conduit, and wherein at least a portion of the translucent or transparent top of the conduit is in alignment above at least a portion of the translucent or transparent bottom of the conduit such that the light emitted by the scintillator array is capable of passing through the second optical window, the passageway of the middle section of the conduit, and the first optical window for detection by the array detector; providing a fluid medium circulation conduit having (i) a first tube member having a first open end, a second open end, and a middle section, wherein the second open end of the first tube member is located opposite of the first open end of the first tube member, and wherein the middle section of the first tube member is disposed between and in communication with the first open end of the first tube member and the second open end of the first tube member, and wherein the first open end of the first tube member is in sealed engagement and communication with the first open end of the conduit of the optical light guide, and wherein the second open end of the first tube member is in sealed engagement and communication with the second open end of the conduit of the optical light for forming a fluid medium circuit passageway between the conduit of the optical light guide and the first tube member of the fluid medium circulation conduit; providing at least one temperature control element that is in communication with the fluid medium circuit passageway; providing at least one fluid medium movement device in communication with the fluid medium circuit passageway; effecting the movement of a fluid medium through the conduit of the optical light guide and the fluid medium circulation conduit of the fluid medium circuit passageway; operating the scintillator array to emit light; passing the scintillator array emitted light (i) through the second optical window of the optical light guide and into the passageway of the conduit of the optical light guide, and then (ii) through the fluid medium moving (flowing) along the passageway of the conduit of the optical light guide, and then (iii) through the first optical window of the optical light guide to the array detector; and establishing temperature stabilization of the photomultiplier device resulting from the passage of the emitted light through the moving fluid medium within the conduit of the optical light guide.

Preferably, this method of temperature stabilization includes providing wherein the fluid medium movement device is a pump (or other like apparatus) for adjusting the rate and volume of the fluid medium passing through the fluid medium circuit passageway.

Another embodiment of the method of this invention, as described herein, includes providing a photomultiplier device that is a silicon photomultiplier or a vacuum photomultiplier tube.

Other embodiments of the method of temperature stabilization of the present invention, as described herein, include adjusting a thermostat of the temperature control element for providing cooled fluid medium for circulation through the fluid medium circuit passageway and the passageway of the conduit of the optical light guide. Preferably, this method includes passing the emitted light of the scintillator array through the second optical window of the optical light guide and through the cooled fluid medium located in the passageway of the conduit of the optical light guide. More preferably, this method includes increasing a signal to noise ratio performance of the scintillator array and the array detector.

Another embodiment of the method of temperature stabilization of the present invention as described herein includes providing the fluid medium that is a mixture of ethylene glycol and water.

In yet another embodiment of the method for temperature stabilization of the present invention, as described herein, includes storing the fluid medium in a reservoir wherein the reservoir is in a sealed engagement and communication with the fluid medium circuit passageway. The reservoir may be accessed by one or more external ports that are in communication with the inside of the reservoir. The ports allow for addition or removal of fluid medium to or from, respectively, the reservoir.

DETAILED DESCRIPTION OF THE INVENTION

Figure 1:
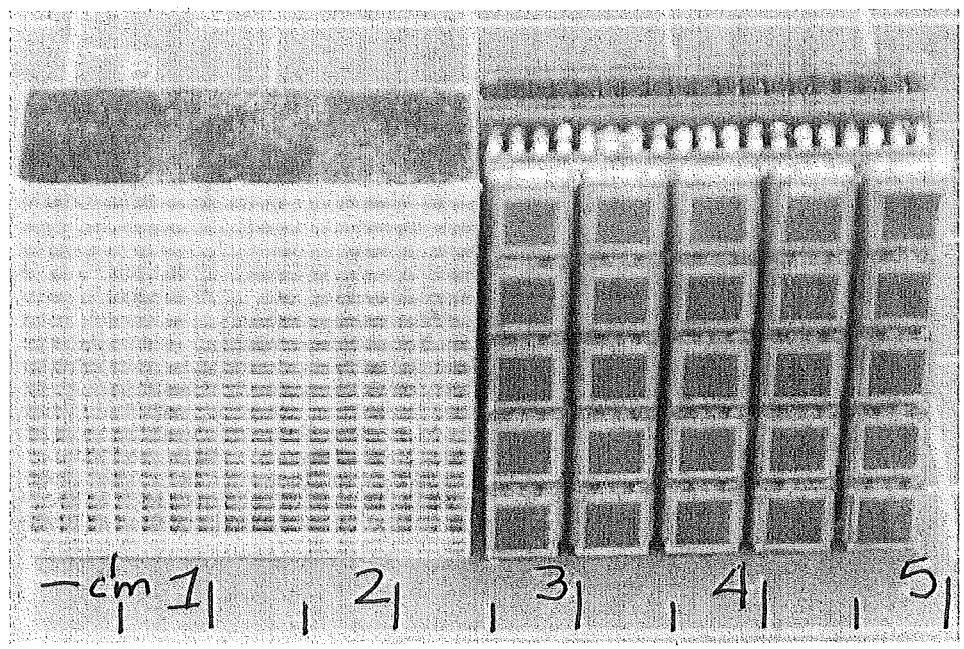
FIG. 1 shows an example of a LYSO array and SiPM matrix detector of the device of the present invention.

The present invention provides a device comprising an imaging detection module having a scintillator array capable of emitting light and an array detector capable of detecting the emitted light from the scintillator array; an optical light guide that is in juxtaposition to and disposed between the scintillator array and the array detector, wherein the optical light guide comprising a conduit having a first open end, a second open end, and a middle section, wherein the second open end of the conduit is located opposite of the first open end of the conduit, and wherein the middle section of the conduit is disposed between and in communication with the first open end of the conduit and the second open end of the conduit, and wherein the conduit has a translucent or transparent top extending for at least a portion of the length of the conduit forming a first optical window, and wherein the conduit has a translucent or transparent bottom extending for at least a portion of the length of the conduit forming a second optical window, and wherein a passageway is established between the first open end of the conduit, the middle section of the conduit, and the second open end of the conduit, and wherein at least a portion of the translucent or transparent top of the conduit is in alignment above at least a portion of the translucent or transparent bottom of the conduit such that the light emitted by the scintillator array is capable of passing through the second optical window, the passageway of the middle section of the conduit, and the first optical window for detection by the array detector; a fluid medium circulation conduit having (i) a first tube member having a first open end, a second open end, and a middle section, wherein the second open end of the first tube member is located opposite of the first open end of the first tube member, and wherein the middle section of the first tube member is disposed between and in communication with the first open end of the first tube member and the second open end of the first tube member, and wherein the first open end of the first tube member is in sealed engagement and communication with the first open end of the conduit of the optical light guide, and wherein the second open end of the first tube member is in sealed engagement and communication with the second open end of the conduit of the optical light for forming a fluid medium circuit passageway between the conduit of the optical light guide and the first tube member of the fluid medium circulation conduit; and at least one temperature control element that is in communication with the fluid medium circuit passageway.

Another embodiment of this invention provides the device, as described herein, wherein the fluid medium circuit passageway includes at least one fluid medium movement device for effecting the movement of a fluid medium through the conduit of the optical light guide and the fluid medium circulation conduit. Preferably, the fluid medium movement device is a pump that is capable of adjusting the rate and volume of the fluid medium passing through the fluid medium circuit passageway.

In another embodiment of the device of this invention as described herein, the scintillator array is a LYSO crystal array such as for example but not limited to a cerium doped lutetium yttrium orthosilicate and the array detector is a silicon photomultiplier (SiPM).

Another embodiment of the device of this invention as described herein includes wherein the temperature control element is capable of stabilizing the temperature of the fluid medium passing (i.e flowing, moving) through the fluid medium circuit passageway which also includes the passageway of the conduit of the optical light guide, and preferably, the temperature control element is capable of lowering the temperature of the fluid medium passing (i.e. flowing, moving) through the fluid medium circuit passageway which also includes the passageway of the conduit of the optical light guide. More preferably, the device of this invention is capable of stabilizing the temperature of the detected light emitted from said scintillator array. Most preferably, the device of the present invention as described herein, is capable of cooling the emitted light of the scintillator array before it is detected by the array detector with the result of increasing a signal to noise ratio performance of the scintillator array and the array detector.

In another embodiment of this invention as described herein, the fluid medium employed in the present device is preferably a mixture of ethylene glycol and water, and more preferably the ratio of ethylene glycol to water is 1:1.

Another embodiment of the device of the present invention as described herein comprises a reservoir hat is in sealed engagement and communication with the fluid medium circuit passageway.

The device of this invention may include one or more ports located along and in communication with the fluid medium circuit passageway, wherein the ports may be entered for adding or replenishing the fluid medium or removing spent fluid medium.

In another embodiment of this invention, an optical light guide is provided comprising a conduit having a first open end, a second open end, and a middle section, wherein the second open end of the conduit is located opposite of the first open end of the conduit, and wherein the middle section of the conduit is disposed between and in communication with the first open end of the conduit and the second open end of the conduit, and wherein the conduit has a translucent or transparent top extending for at least a portion of the length of the conduit forming a first optical window, and wherein the conduit has a translucent or transparent bottom extending for at least a portion of the length of the conduit forming a second optical window, and wherein a passageway is established between the first open end of the conduit, the middle section of the conduit, and the second open end of the conduit, and wherein at least a portion of the translucent or transparent top of the conduit is in alignment above at least a portion of the translucent or transparent bottom of the conduit.

In another embodiment of the optical light guide of this invention, as described herein, a scintillator array is disposed in juxtaposition to, and preferably below, the second optical window of the optical light guide and wherein an array detector is disposed in juxtaposition to, and preferably above, the first optical window of the optical light guide.

Another embodiment of the optical light guide of the present invention, as described herein, includes wherein the passageway of the optical light guide is capable of receiving an influx of a temperature controlled fluid medium at the first open end of the conduit, and wherein the temperature controlled fluid medium is capable of passing through the passageway and forming an effluent stream of the temperature controlled fluid medium at the second open end of the conduit. Alternatively, the passageway of the light guide of the present invention is capable of receiving an influx of a temperature controlled fluid medium at the second open end of the conduit, and wherein the temperature controlled fluid medium is capable of passing through the passageway and forming an effluent stream of temperature controlled fluid medium at the first open end of the conduit.

Another embodiment of the optical light guide of the present invention, as described herein, includes providing a fluid medium circulation conduit comprising (i) a first tube member having a first open end, a second open end, and a middle section, wherein the second open end of the first tube member is located opposite of the first open end of the first tube member, and wherein the middle section of the first tube member is disposed between and in communication with the first open end of the first tube member and the second open end of the first tube member, and wherein the first open end of the first tube member is in sealed engagement and communication with the first open end of the conduit of the optical light guide, and wherein the second open end of the first tube member is in sealed engagement and communication with the second open end of the conduit of the optical light for forming a fluid medium circuit passageway between the conduit of the optical light guide and the first tube member of the fluid medium circulation conduit. Preferably, the optical light guide includes at least one temperature control element that is in communication with said fluid medium circuit passageway. Another embodiment includes wherein the optical light guide of the present invention includes wherein the fluid medium circuit passageway includes at least one fluid medium movement device for effecting the movement (i.e. flow) of a fluid medium through the conduit of the optical light guide and the fluid medium circulation conduit. Preferably, the fluid medium movement device is a pump or other such apparatus that is capable of adjusting the rate and volume of the fluid medium passing through the fluid medium circuit passageway. It will be appreciated by those persons skilled in the art that any number of configurations of one, two, three or more tube members may be made to accommodate cooling or other temperature stabilization apparatus, pumps, and reservoirs along and in communication with the fluid medium circuit passageway without departing from the scope of the present invention as described herein.

In yet another embodiment, the optical light guide of the present invention, as described herein, includes wherein the temperature control element is capable of stabilizing, and preferably lowering, the temperature of the fluid medium passing through the fluid medium circuit passageway.

Another embodiment of the optical light guide of the present invention, as described herein, includes wherein the optical light guide is in juxtaposition to and disposed between a scintillator array and an array detector.

In another embodiment of this invention, a method of temperature stabilization for photomultiplier-based devices is disclosed. This method comprises providing a photomultiplier device comprising an imaging detection module having a scintillator array capable of emitting light and an array detector capable of detecting the emitted light from the scintillator array; providing an optical light guide that is in juxtaposition to and disposed between the scintillator array and the array detector, wherein the optical light guide comprising a conduit having a first open end, a second open end, and a middle section, wherein the second open end of the conduit is located opposite of the first open end of the conduit, and wherein the middle section of the conduit is disposed between and in communication with the first open end of the conduit and the second open end of the conduit, and wherein the conduit has a translucent or transparent top extending for at least a portion of the length of the conduit forming a first optical window, and wherein the conduit has a translucent or transparent bottom extending for at least a portion of the length of the conduit forming a second optical window, and wherein a passageway is established between the first open end of the conduit, the middle section of the conduit, and the second open end of the conduit, and wherein at least a portion of the translucent or transparent top of the conduit is in alignment above at least a portion of the translucent or transparent bottom of the conduit such that the light emitted by the scintillator array is capable of passing through the second optical window, the passageway of the middle section of the conduit, and the first optical window for detection by the array detector; providing a fluid medium circulation conduit having (i) a first tube member having a first open end, a second open end, and a middle section, wherein the second open end of the first tube member is located opposite of the first open end of the first tube member, and wherein the middle section of the first tube member is disposed between and in communication with the first open end of the first tube member and the second open end of the first tube member, and wherein the first open end of the first tube member is in sealed engagement and communication with the first open end of the conduit of the optical light guide, and wherein the second open end of the first tube member is in sealed engagement and communication with the second open end of the conduit of the optical light for forming a fluid medium circuit passageway between the conduit of the optical light guide and the first tube member of the fluid medium circulation conduit; providing at least one temperature control element that is in communication with the fluid medium circuit passageway; providing at least one fluid medium movement device in communication with the fluid medium circuit passageway; effecting the movement of a fluid medium through the conduit of the optical light guide and the fluid medium circulation conduit of the fluid medium circuit passageway; operating the scintillator array to emit light; passing the scintillator array emitted light (i) through the second optical window of the optical light guide and into the passageway of the conduit of the optical light guide, and then (ii) through the fluid medium moving (flowing) along the passageway of the conduit of the optical light guide, and then (iii) through the first optical window of the optical light guide to the array detector; and establishing temperature stabilization of the photomultiplier device resulting from the passage of the emitted light through the moving fluid medium within the conduit of the optical light guide.

Preferably, this method of temperature stabilization includes providing wherein the fluid medium movement device is a pump (or other like apparatus) for adjusting the rate and volume of the fluid medium passing through the fluid medium circuit passageway.

Another embodiment of the method of this invention, as described herein, includes providing a photomultiplier device that is a silicon photomultiplier or a vacuum photomultiplier tube.

Other embodiments of the method of temperature stabilization of the present invention, as described herein, include adjusting a thermostat of the temperature control element for providing cooled fluid medium for circulation through the fluid medium circuit passageway and the passageway of the conduit of the optical light guide. Preferably, this method includes passing the emitted light of the scintillator array through the second optical window of the optical light guide and through the cooled fluid medium located in the passageway of the conduit of the optical light guide. More preferably, this method includes increasing a signal to noise ratio performance of the scintillator array and the array detector.

Another embodiment of the method of temperature stabilization of the present invention as described herein includes providing the fluid medium that is a mixture of ethylene glycol and water.

In yet another embodiment of the method for temperature stabilization of the present invention, as described herein, includes storing the fluid medium in a reservoir wherein the reservoir is in a sealed engagement and communication with the fluid medium circuit passageway. The reservoir may be accessed by one or more external ports that are in communication with the inside of the reservoir.

Radiation detectors with scintillator pixels-to-SiPMs coupling ratios higher than 1 to 1 require light spreading windows between the crystal arrays output and SiPM input surfaces. The present invention introduces cooling with flowing recirculating cooled clear optical liquid encapsulated between two thin (such as for example, but not limited to 250 μm thick) optical windows. Thus, cooling and light conductivity are combined into a single unit. The window is in optical and thermal contact with the SiPM sensors and therefore provides highly efficient cooling and light spreading capabilities. Additional benefit of such a method is cooling of a scintillator. Most of the scintillators exhibit increase of light yield with decreasing temperature, which enhances imaging characteristics of the detector.

In the device of the present invention, cooling and recirculation of the fluid is accomplished via a low flow peristaltic pump with a series of attached thermoelectric coolers, placed in the vicinity of the detector modules and with delivery tubing, properly isolated from the ambient environment. Flow rate has to be limited in order to avoid pressure build up in the optical window, which has to be relatively thin (such as for example but not limited to about 2-3 mm in thickness).

The optical light guide of this invention is preferably a cooling optical light guide for use with high spatial resolution detection of radiation.

In an embodiment of the invention, a transparent cooling fluid is used for removing heat from the light detector and spreading scintillation light among several SiPM units. Cooled liquid passes through a 2 mm opening between two Mylar sheets. Mylar sheets are held together with an aluminum frame. An array of SiPMs and an array of LYSO scintillation crystals are attached to opposite sides of the cooling light guide. Temperature uniformity of the optical surface was evaluated with an infrared camera. Temperature gradient of 0.09° C./cm was measured along the direction of the coolant flow. The system was tested with a 5×5 array of Hamamatsu S10943 SiPMs coupled to a 16×16 matrix of 1.5×1.5×10 mm LYSO crystals. Testing procedures included evaluation of temperature dependence of detector gain, integrated noise, ability to resolve individual crystals and energy resolution. Detector gain varied by 9.3% over the range of 5° C. Energy resolution change of 5% was observed over the same temperature range. Integrated noise contribution showed moderate increase of 2.2% over the range of 7° C. The separation of individual crystals was found adequate with only a weak dependence of peak-to-valley contrast ratios on temperature. An assessment of performance stability at constant temperature revealed 0.2% variation in gain and 0.7% variation in energy resolution during an hour-long acquisition. Thus one skilled in the art will appreciated that the device, the optical light guide, and the method of the present invention are useful for cooling and temperature stabilizing of SiPM-based systems.

EXAMPLES OF PREFERRED EMBODIMENTS OF THIS INVENTION

I. Materials and Methods

A. MPPC-Based Detector Module

The high-resolution detector module consists of a 16×16 array of 1.5×1.5×10 mm$^3$ LYSO detector elements (pitch 1.57 mm) (Proteus, Inc., Chagrin Falls, Ohio). Each array element is wrapped with enhanced specular reflective (ESR) film for optical isolation. The light from the scintillator array is detected by a 5×5 array of 3×3 mm$^2$ (5 mm pitch) S10943-series MPPC silicon photomultipliers (Hamamatsu Photonics, Inc., Hamamatsu City, Japan). Each MPPC contains 3600 microcells with a 50-μm pitch in a ceramic packaging. The gains of individual MPPCs in an array are matched by the manufacturer with a typical variability of 3% measured at 25° C. MPPC assembly is mounted on a custom-built 25-channel readout active base (AiT Instruments, Newport News, Va.). The active base provides common power to all the MPPCs and contains individual pre-amplifiers for each of the 25 channels of the MPPC array. Bias voltage was set to manufacturer recommended value of 70.5 V. The detector components are shown in FIG. 1. The detector components are coupled to the light guide with Visilox V-788 optical grease compound.

B. Optical Spreader Assembly and Cooling System

Figure 2:
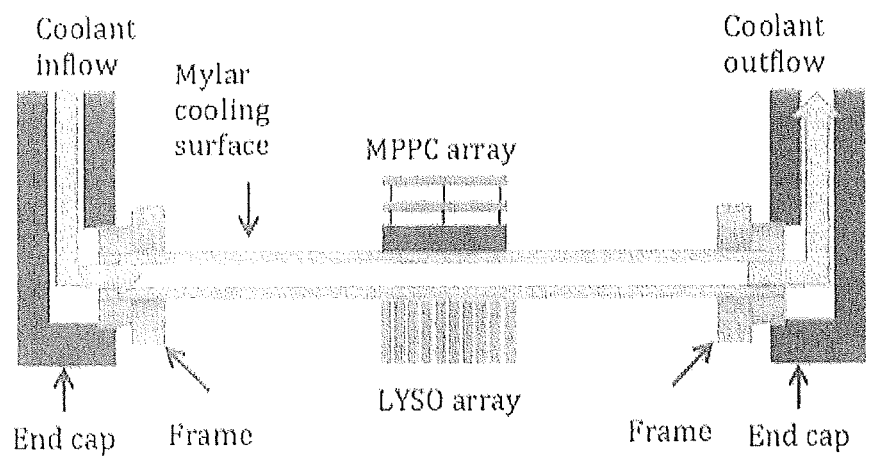
FIGS. 2(a) and (b) show a side view of a preferred example of the optical light guide of the present invention.
FIG. 2(c) shows a top view of a preferred example of the device of the present invention
Figure 2:
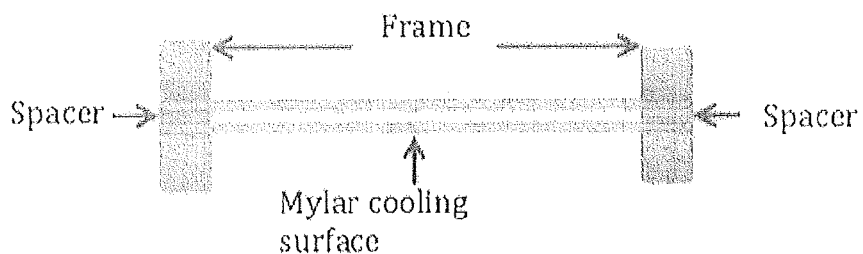
Figure 2:
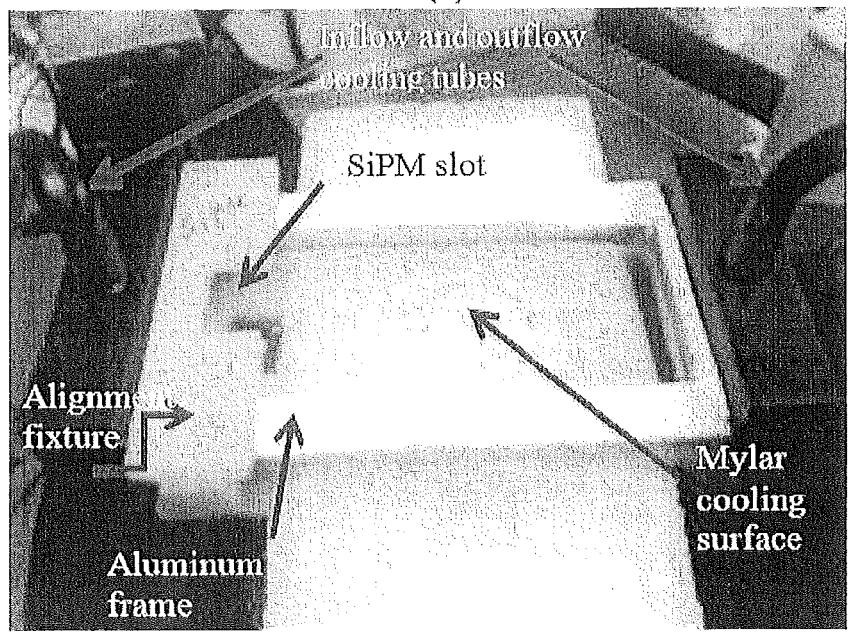

The cooling light guide assembly is comprised of two rectangular aluminum frames, two 2 mm thick aluminum spacers and two sheets of 250 μm thick Mylar film sandwiched between the frames and sidebars. The assembly is fastened together with machine screws. Exposed aluminum surfaces are covered with thermally insulating tape to reduce heat losses in the frame. Finally, front and back ends of the assembly are press-fitted and glued into Delrin end caps. A passageway for fluid is machined into each of the end caps to provide intake and outflow of the cooling medium. Total thickness of the cooled optical contact surface is 2.5 mm. Cross-sectional views of the "cooling liquid light guide" of the present invention are shown in FIG. 2.

Figure 3:
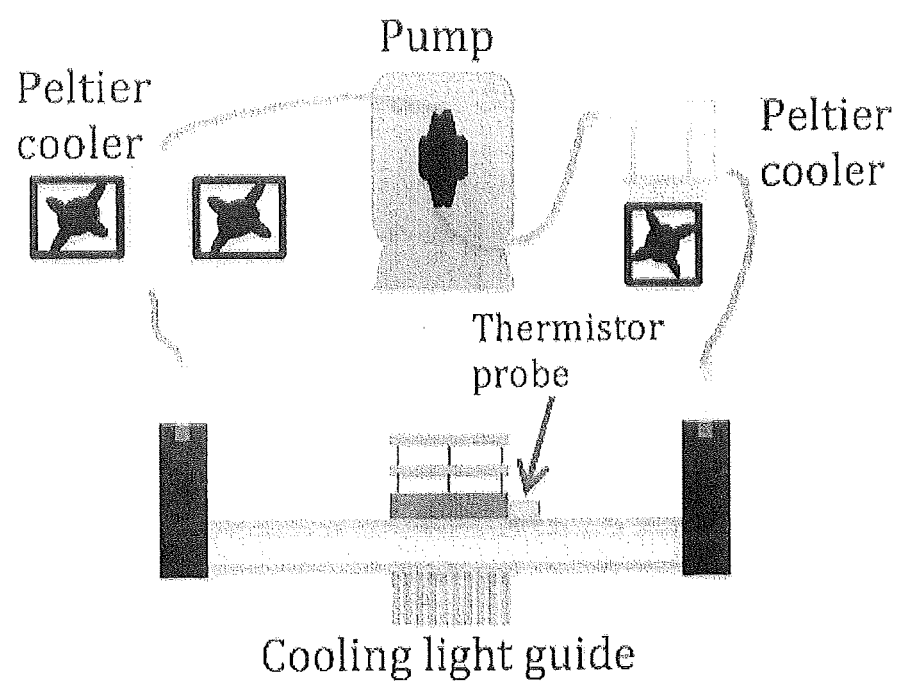
FIG. 3 shows a schematic of a preferred embodiment of the device of the present invention.

A mixture of technical grade ethylene glycol and distilled water (1:1 ratio) was chosen as cooling fluid. According to technical specifications, such a mixture can be safely cooled down to −25° C. Cooling fluid re-circulation is provided by a Pulsatron A-plus series diaphragm pump (PulsaFeeder, Punta Gorda, Fla.). Adjusting the amplitude and frequency of the diaphragm motion controls flow rate in the system. The two stage cooling system consists of a storage reservoir and final cooling stage. The reservoir's bottom incorporates a horizontal copper plate with two other copper plates attached vertically. The bottom copper plate is in thermal contact with the cold side of a 60 W Peltier cooling element. Power to the Peltier cooler is provided by a 12V, 5 A ATX power supply. The final cooling stage incorporates two 60 W Peltier elements coupled to a two-piece aluminum block. A snake-like pattern was machined inside the aluminum block and barbed house fittings were attached to entry and exit holes in the block. One of the Peltier elements was powered by another 12 V ATX power supply, while the other one was connected to UniSource PS 3030DU adjustable power supply (Unisource Corp, Seoul, Korea). The adjustable power supply was employed to control and adjust the supply current to provide temperature range, needed for some of the measurements performed. Schematic drawing of the cooling circuit is presented in FIG. 3.

C. Data Acquisition System

The active readout base is connected to an MPPC-16 control module (AiT Instruments). The control module provides power to individual MPPCs and receives individual signals from each array element. The individual analog signals from the control electronics are digitized with a custom 64-channel FPGA-based ADC (AiT Instruments) [11], processed and stored. Prior to digitization all the signals are summed and the sum signal is sent to a P/S 715 constant-fraction discriminator (Philips Scientific, Mahwah, N.J.). The discriminated pulses are used as triggers for data digitization. Identification of the interaction point in the scintillator array is accomplished via center-of-mass calculation of the digitized signals and pre-measured crystal and energy lookup tables. This method facilitates accurate and rapid determination of photon interaction points in the detector. Energy and position information is sorted into histograms using Kmax Scientific software package (Sparrow Corp, Port Orange, Fla.)

D. Testing Procedures

In order to explore the effectiveness of the proposed technique, thermal stability and uniformity of the light guide was assessed. Temperature stability over various time periods was measured with an Omega 866C electronic thermistor meter (Omega Engineering, Stamford, Conn.) coupled to a high sensitivity 400-series thermistor probe. The thermistor probe was positioned to be in contact with the side of the light guide and touching the detector array. A piece of foam was inserted between the support frame and the detector to apply gentle pressure necessary for maintaining thermal contact. Uniformity of cooling was measured using a Flir i5 IR thermo-imaging camera (Extech Instruments, Nashua, N.H.). Infrared images of the cooled surface were taken at several temperature settings. Images were evaluated for local variations as well as temperature gradient along the fluid flow direction. SiPM detector was powered off and moved to the edge of the light guide.

During detector calibration, the device underwent standard correction procedures. A measurement of the ADC pedestals, crystal mapping for linearity corrections and energy mapping to correct for difference in energy response between individual crystal elements were performed.

Next, imaging performance of the SiPM detector was studied. Intrinsic spatial resolution and energy resolution were characterized as a function of temperature in the temperature range (12-19 degrees Centigrade). Profiles through the central (row 8) of the uncorrected images were obtained by drawing a rectangular region-of-interest, enclosing count distribution of a single row of scintillation crystals. Peak-to-valley contrast ratios (PVCR) between adjacent pixels, defined as a difference between peak count and valley count divided by the peak count, yielded an estimate of spatial resolution variations with temperature. Temperature dependence of detector gain and energy resolution was evaluated by obtaining energy response curves at different temperature points. Each energy curve was fitted with a sum of Gaussian and linear functions. Variation in fitted peak position is directly proportional to changes in detector gain, while the ratio of full width at half maximum (FWHM) of the fitted curve to the 511 keV peak position estimated detector energy resolution. Measuring response of individual SiPMs to external trigger signals assessed contribution of integrated noise at different temperatures. The LYSO array was removed from the system for these measurements due to the natural background radioactivity from Lu-176. Thus, the only contribution to the recorded counts was that of dark current. A 10 kHz NIM pocket pulser was used as an external trigger source. NIM pulses were sent to the discriminator; the same way as a sum signal described in part C. ADC pedestal values were subtracted from the resulting counts to obtain integrated noise contribution. Finally, detector stability was evaluated by collecting a list-mode data set over a period of 1 hour with a constant temperature setting of 12° C.

II. Results

Figure 4:
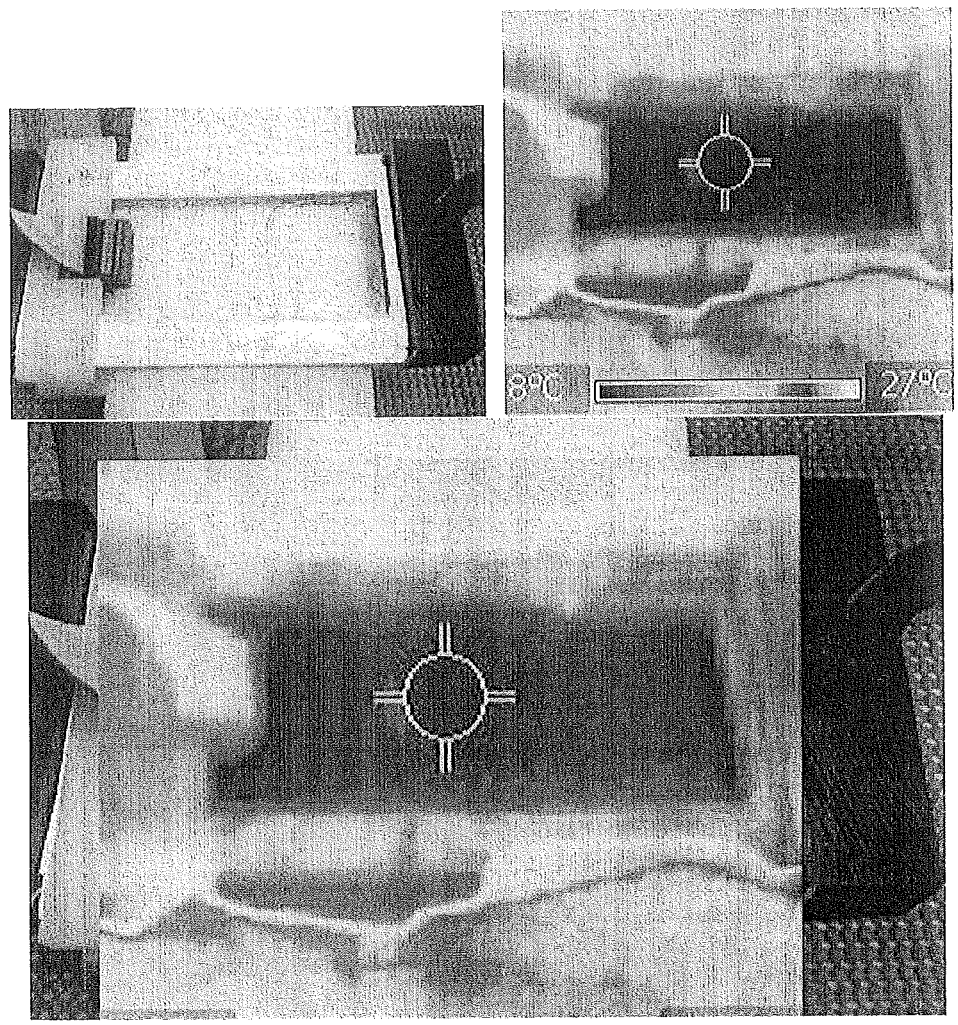
FIG. 4 shows a representative temperature distribution image taken with an infrared thermometer. Temperature variations do not exceed 1 degree C. over the whole optical surface.

FIG. 4 shows temperature distribution over the area of the light guide. The image taken with the infrared thermometer demonstrates a slow varying temperature gradient along the direction of the coolant flow. A valley-type temperature variation was observed in the direction perpendicular to the flow, with temperature variation of 1.3 degrees C. from the center to the edge of the light guide.

Profiles through a temperature color map along and perpendicular the flow direction were obtained. A linear function was fitted to the profile along the coolant flow direction. Quadratic function fit as applied to the profile perpendicular to the flow direction. Profiles and fits are presented in FIG. 5.

Linear fit yielded a 0.09° C./cm linear coefficient of the temperature growth with the distance from the inlet side of the light guide. Quadratic fit to the perpendicular profile revealed 0.143° C./cm$^2$, −0.622° C./cm and 9.33° C. for the values of quadratic, linear and free term parameters respectively.

List-mode gamma data, containing position information, energy and time stamp for each detected event was collected for a period of 20 minutes, during which time the cooling system was allowed to reach equilibrium. Temperature readings were recorded every minute. Event data was replayed using IDL software (Exelis Visual, Boulder, Colo.). Data points were grouped with a time bin of 1 minute. A sum of linear and Gaussian functions was fit to the energy distribution histograms. A sample energy distribution is displayed in FIG. 6. Peak positions corresponding to 511 keV gamma rays as a function of temperature are displayed in FIG. 7. Variation of 9.3% in peak position over temperature range of 5° C. is observed from the graph. Linear fit to the resulting curve reveals an approximate drop of 2.2% per degree Centigrade.

Figure 8:
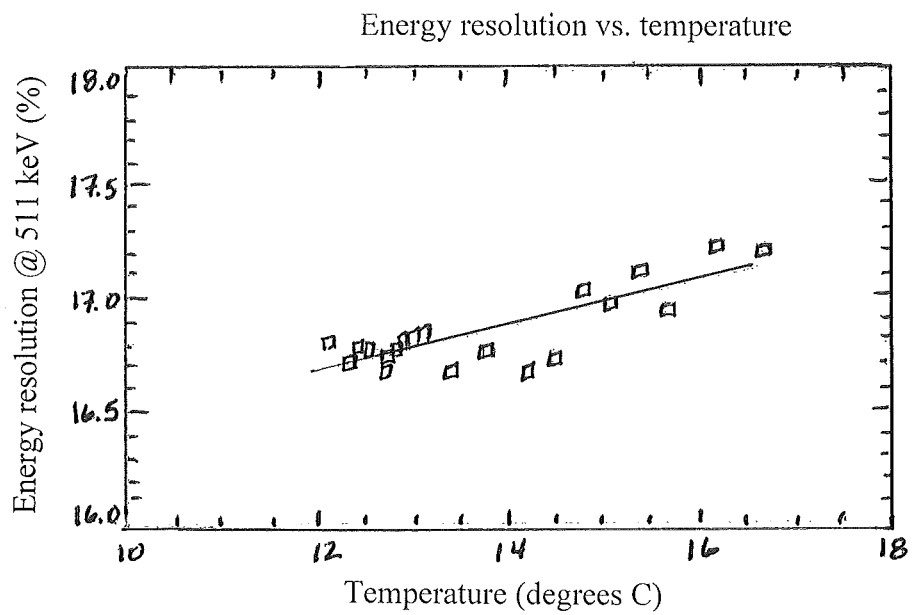
FIG. 8 shows energy resolution as a function of temperature.

Temperature dependence of detector energy resolution is plotted in FIG. 8. Energy resolution exhibits less of a relative change than that of the peak position, approximately 5% over the same range of temperatures.

Figure 9:
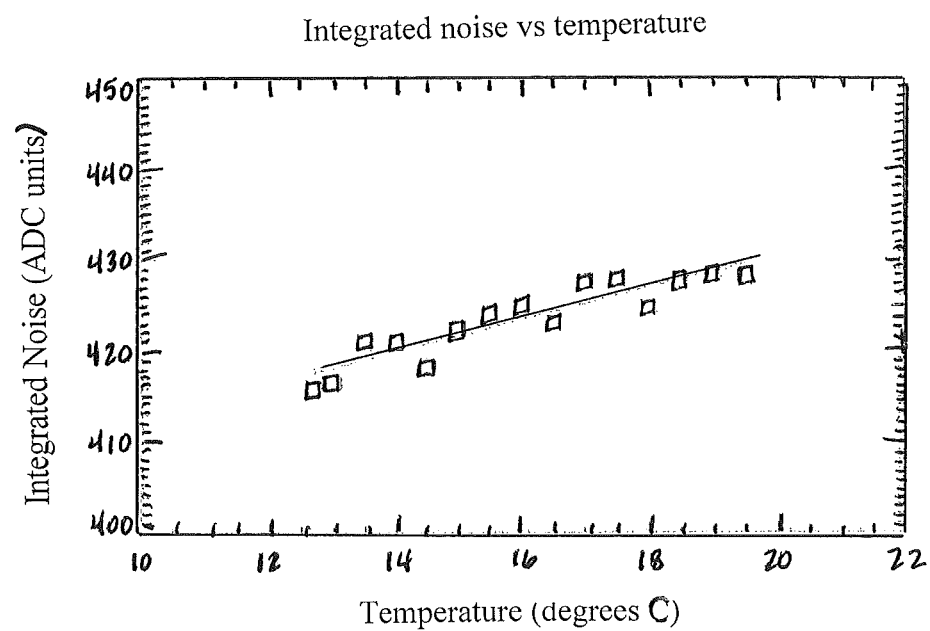
FIG. 9 shows temperature dependence of the integrated noise signals plotted as a function of temperature.
Figure 10:
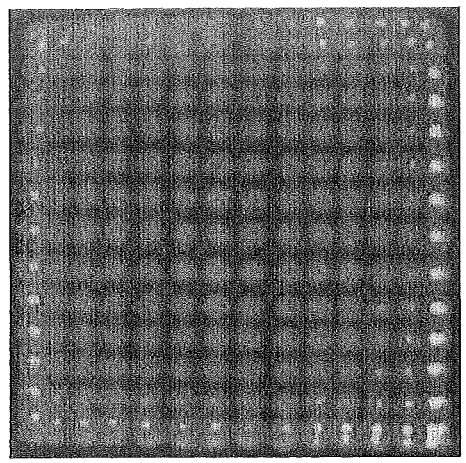
FIGS. 10(a) and (b) show raw images obtained at (a) 12.5° C. and b) 19° C., respectively. No corrections were applied except for energy discrimination.
Figure 10:
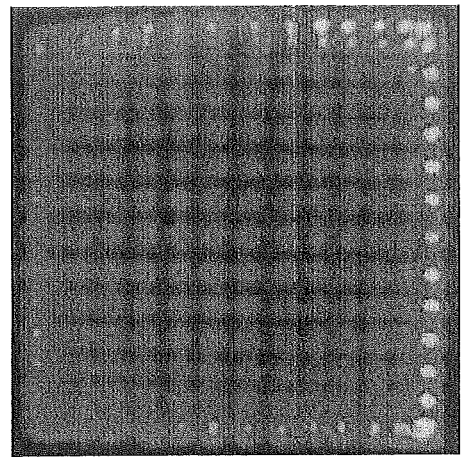
Figure 11:
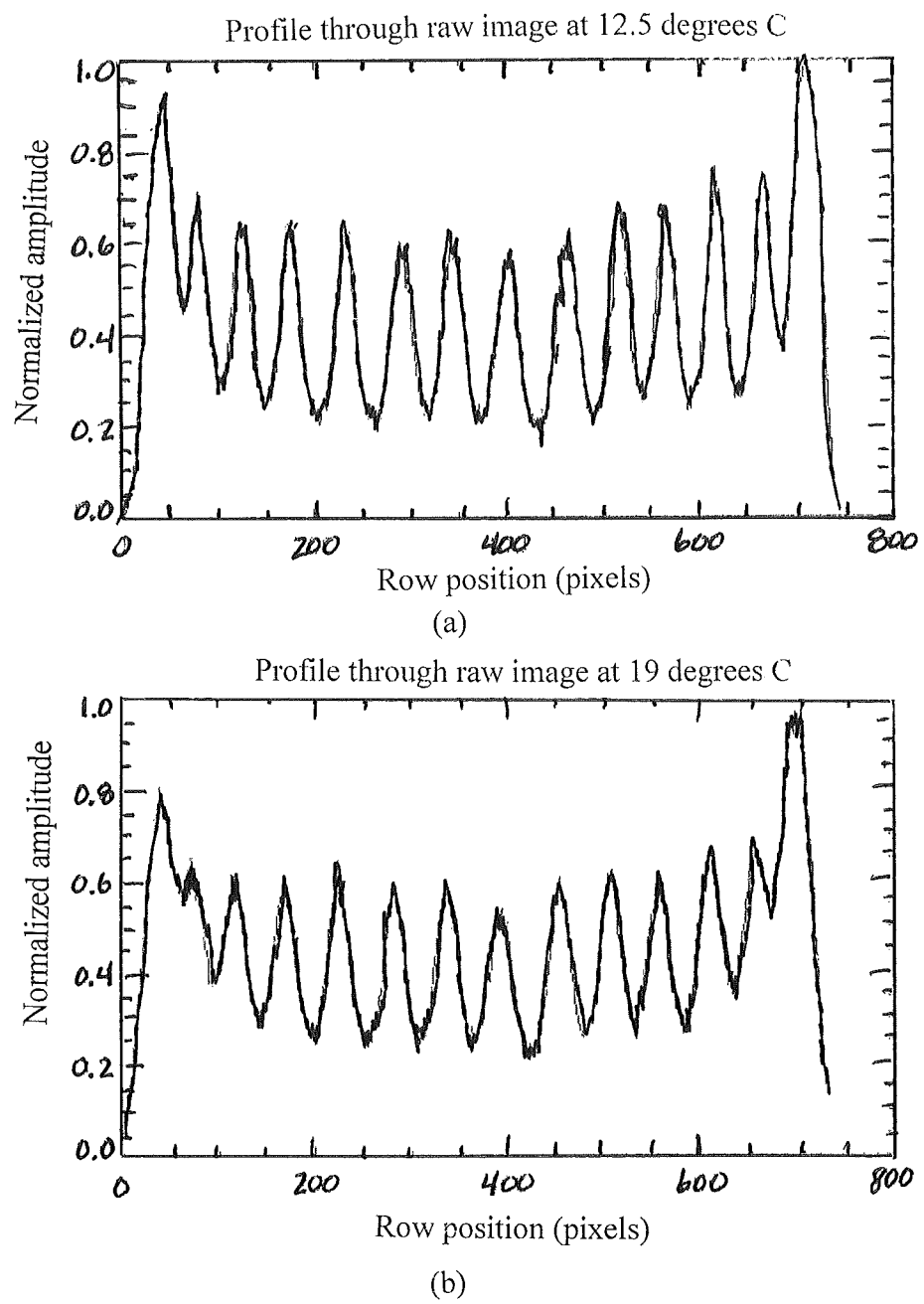
FIGS. 11(a) and (b) show intensity profiles from the image shown in FIG. 8: profiles drawn through the row 8 at (a) 12.5° C. and (b) at 19° C., respectively.

Noise signals integrated for 350 ns are plotted as a function of temperature in FIG. 9. As shown in FIG. 9, the integrated noise contribution increases with temperature at a rate of 1.77 ADC units per degree or approximately 0.4% per degree C. (centigrade). FIG. 10 shows sorted histogram data were acquired for a period of 10 minutes at several temperatures from 19° to 12.5° C. Temperature stability was within 0.1° C. for all the measurement points. FIG. 10 presents raw images at (a) 12.5° and (b) 19° C., while FIGS. 11(*a*) at 12.5 degrees C. and (*b*) at 19 degrees C., contain profiles taken through a single row of pixels. Finally, FIG. 12 displays calculated peak-to-valley ratios as a function of temperature.

While images at lower temperatures appear sharper, the detector's ability to resolve individual elements does not show a strong dependence on the temperature. Approximately 1.5% change in peak-to-valley contrast ratio per degree in the range of 7° C. was observed from FIG. 12.

Figure 13:
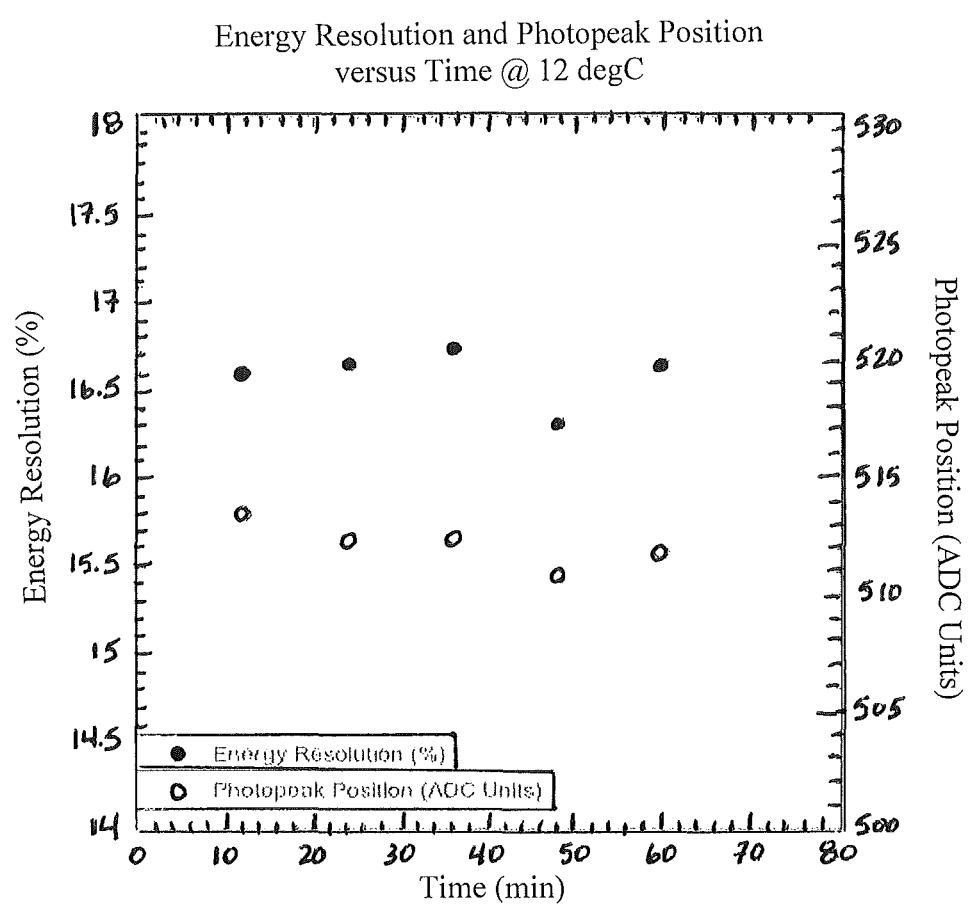
FIG. 13 shows peak position as a function of time obtained during an hour-long acquisition. Average peak position was 512.2+/−1.0 analog units. Average energy resolution at 511 keV turned out to be 16.72+/−0.12%.

Obtaining an hour-long list-mode data set was used to assess detector stability. Data points were replayed with 10 minutes increment. Temperature variations were within 0.1° C. FIG. 13 shows peak positions as a function of time (minutes) during an hour long acquisition.

Figure 14:
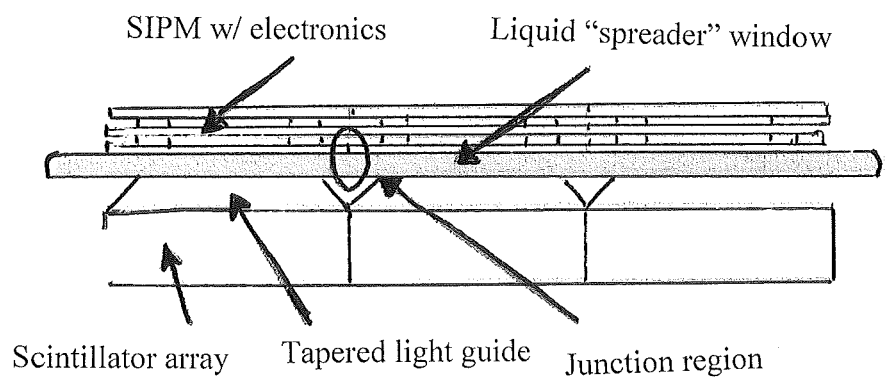
FIG. 14 shows another preferred embodiment of the cooled optical light guide of the present invention: a combination of a tapered light guide and liquid light guide. Use of the tapered light guide minimizes the effects of the SiPM edge effects on the detector response, especially at the junction regions between individual SiPMs. The liquid light guide serves two purposes: (1) adding additional light spreading function to the light scintillation emerging from the tapered light guide, (2) cooling and/or temperature stabilizing of the SiPM modules.

FIG. 14 shows another preferred embodiment of the cooled optical light guide of the present invention: a combination of a tapered light guide and liquid light guide. Use of the tapered light guide minimizes the effects of the SiPM edge effects on the detector response, especially at the junction regions between individual SiPMs. The liquid light guide serves two purposes: (1) adding additional light spreading function to the light scintillation emerging from the tapered light guide, (2) cooling and/or temperature stabilizing of the SiPM modules.

Figure 5:
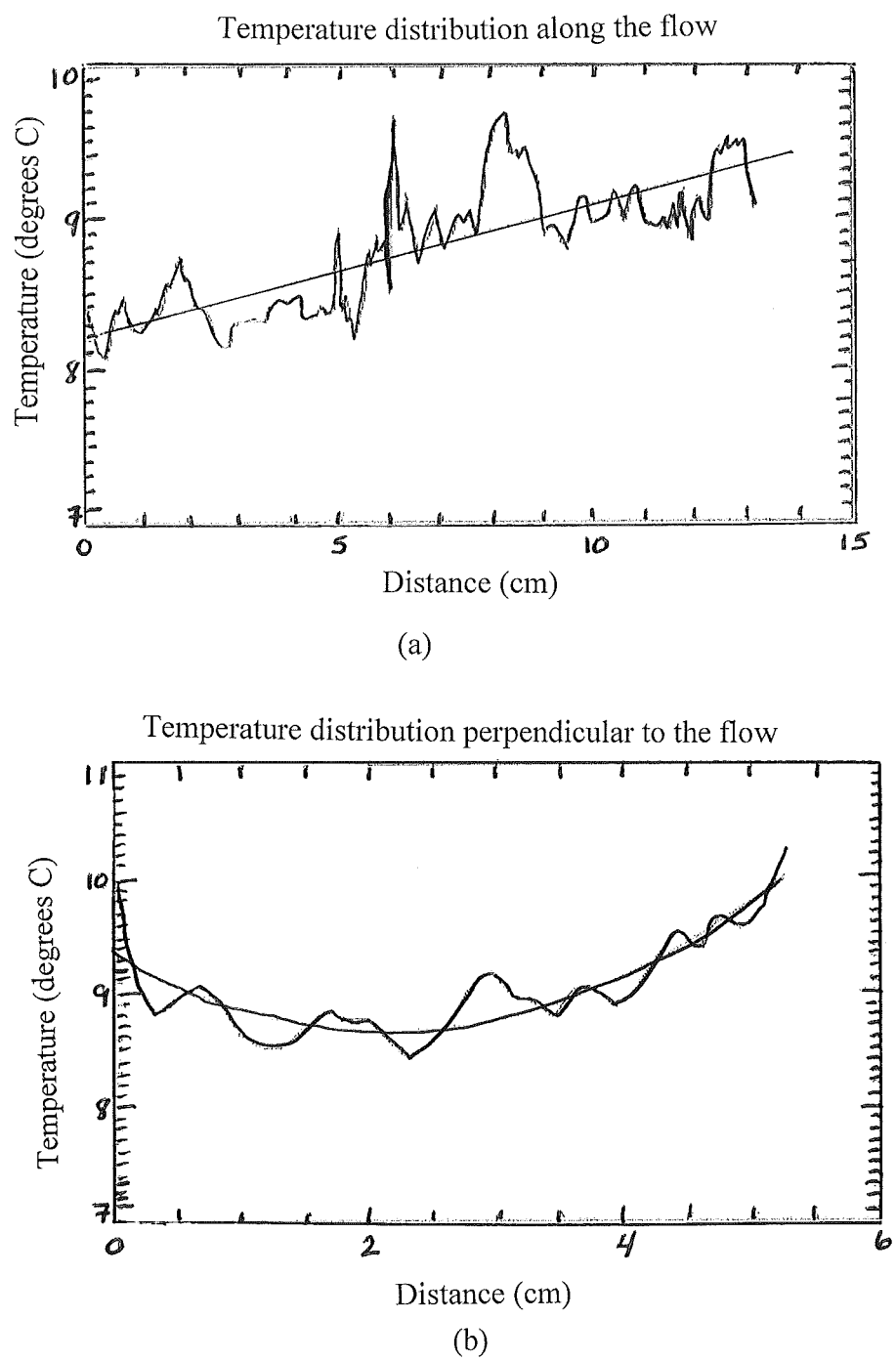
FIGS. 5(a) and (b) show peak position of the energy histogram as a function of temperature.

As demonstrated in FIG. 5, cooling uniformity of the prototype light guide is within 1 degree C. in the direction of the flow with a rate of change of 0.09° C./cm. Temperature variation in the direction perpendicular to the flow is slightly above 1 degree C. Such discrepancy is attributed to the heat losses due to high heat conductivity of the aluminum frame in combination with its insufficient thermal insulation. Replacing aluminum with plastic to construct the frame with lower heat conductivity will decrease the temperature gradient. Also, utilizing multiple entry ports can spread coolant delivery, making it more uniform.

Figure 6:
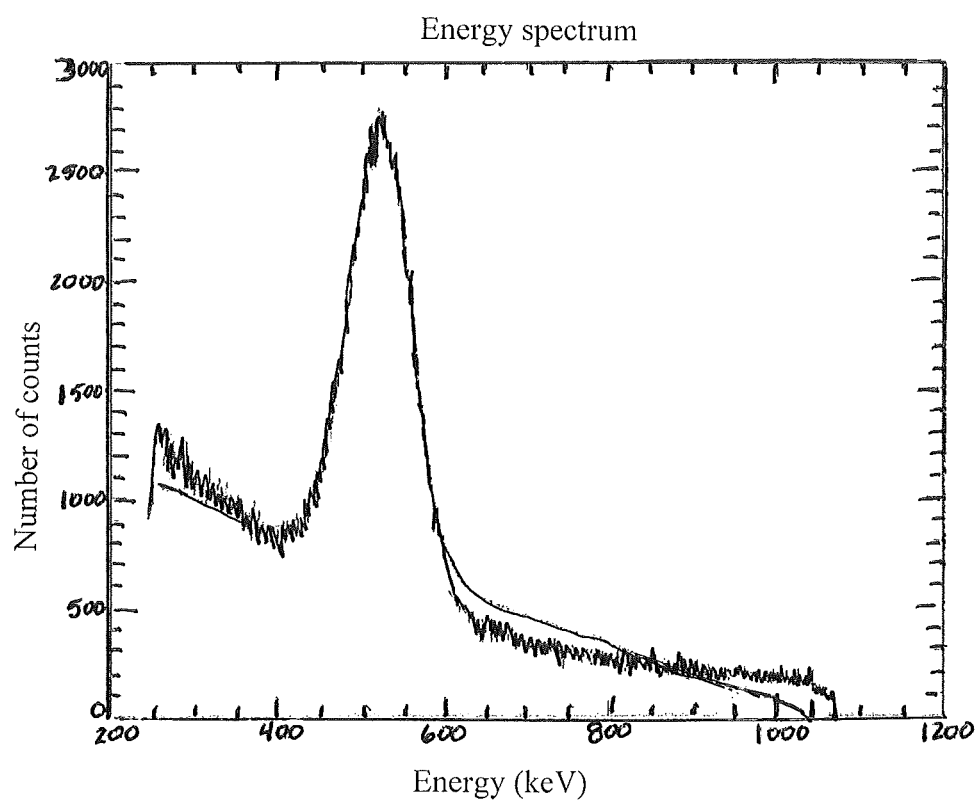
FIG. 6 shows a sample energy distribution histogram. Sum of Gaussian and linear functions fit is shown as solid (non-jagged) line.
Figure 7:
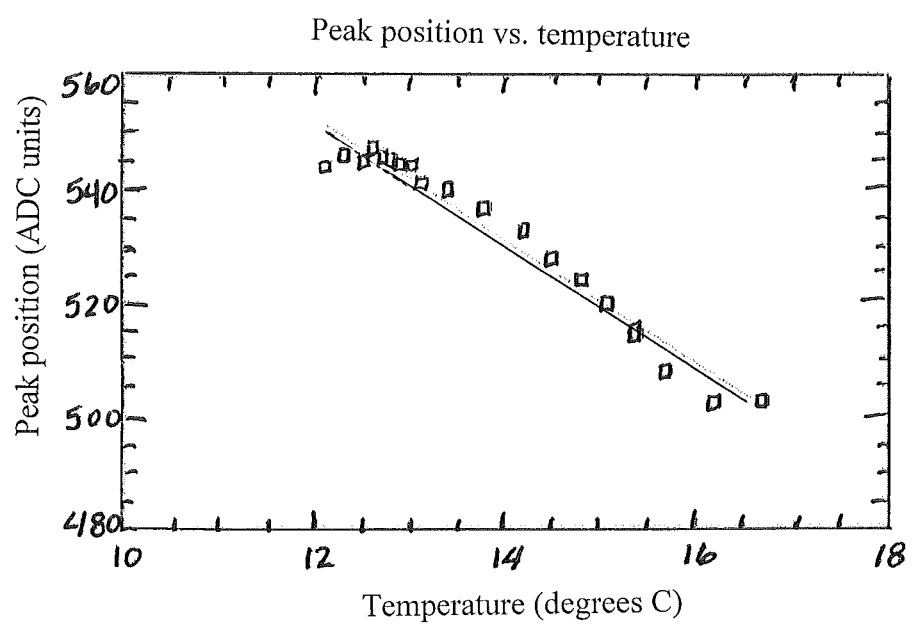
FIG. 7 shows peak position of the energy histogram as a function of temperature.

The temperature dependence of detector response was studied for a range of temperatures achievable with a prototype of the device of the present invention. FIGS. 6 and 7 clearly demonstrate the advantage of lower temperature operation point. Peak position of the energy histogram, which is directly proportional to detector gain, shifts by almost 10% over 5° C. range. Energy resolution exhibits less of a relative change, but, for example, at 12° C. energy resolution below 17% at 511 keV can be obtained. Noise contribution measured as a function of temperature showed only slight increase, ~0.4% per degree Centigrade. Such a small change in the integrated noise can be attributed to a significant drop in gain of the device. So, although theory predicts an increase in frequency of thermally generated cell breakdowns with temperature, a drop in detector gain factor limits the noise contribution to the output signal.

Figure 12:
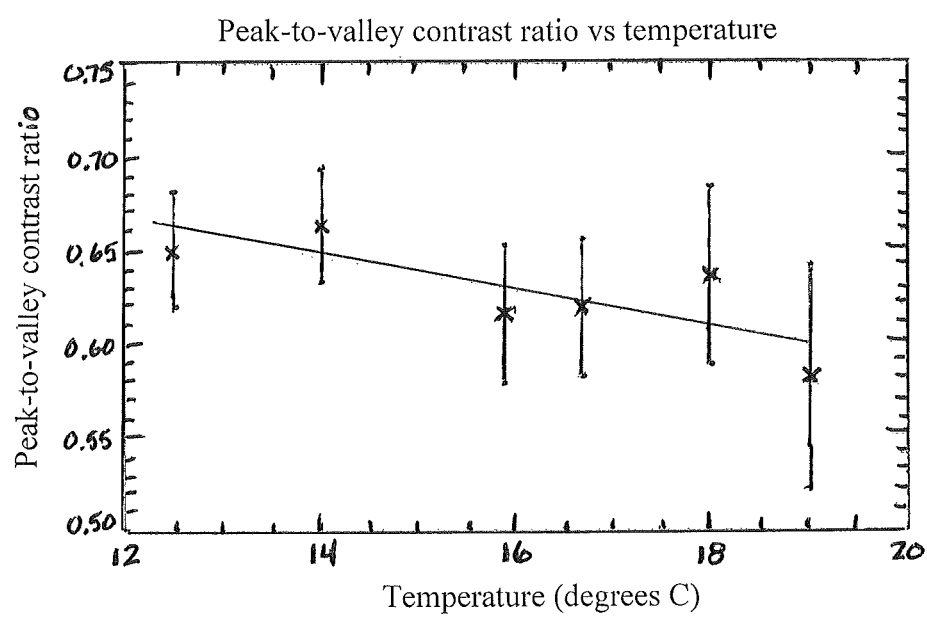
FIG. 12 shows peak-to-valley contrast ratios as a function of temperature.

Stability of the device of the present invention is illustrated in FIGS. 12 and 13. It is evident that variations in energy response characteristics as a function of time are comparable to statistical variations of the measurements involved. These results confirm stable operation of cooling system. The good energy resolution also indicates the good optical transmission of the new optical light guide of the present invention.

Characterization of spatial resolution revealed subtle, yet noticeable improvements in detector's ability to resolve individual crystal elements. The image at 19° C. looks fuzzier than the one taken at 12° C., as can be seen in FIG. 9. Profiles taken through the same row shows a little better peak separation, especially at the edges of the detector. Peak-to-valley contrast ratio shows a slight increase with decrease of temperature. The small increase is attributable to relatively good pixel separation in most of the detector area at 19° C., the starting temperature for the measurement.

Based on the results, the device of the present invention including the optical light guide of the present invention improves performance of SiPM-based detectors. The device of the present invention delivered stable cooling down to 12° C. without special efforts to limit heat losses. Thermal insulation of the coolant delivery tubing as well as decreasing heat conductivity of the light guide frame will improve temperature stability and will allow for lower operation points.

The cooling method in its current implementation is not readily applicable to conventional PET ring geometry, but the primary intended application of the method is in construction of a large area (15×20 cm) flat-panel detector. Frame size does not have a big influence for planar detector geometries, unlike ring geometry, where dead spaces between the detector modules have to be minimized. Scaling the system to a larger size detector presents little challenge from the point of view of the overall design. A larger detector will necessitate higher flow rate so that a standard mini chiller can be used. Also, increased weight of the components of a bigger detector should require higher hydraulic pressure to prevent component from collapsing due to gravity. Use of a mini chiller will simplify the system by eliminating the need for extra cooling elements in the flow circuit, so the system can be made more robust. Higher pressure in the hydraulic system will also permit installation of more inlets, thus mitigating the problem of temperature variations in the direction perpendicular to the flow.

It will be appreciated by those persons skilled in the art that the device of the present invention lowers and stabilizes the temperature of a radiation detector based on silicon photomultiplier technology. Testing demonstrated its potential utility in various nuclear medicine applications. Wide variety of materials and designs can be used to construct cooling apparatus suited for a particular system, such as MRI-compatible, PET or SPECT instrumentation.

Whereas particular embodiments of the instant invention have been described for purposes of illustration, it will be evident to those persons skilled in the art that that numerous variations and details of the instant invention may be made without departing from the instant invention as defined in the appended claims.

What is claimed is:

1. A device comprising:
    an imaging detection module having a scintillator array capable of emitting light and an array detector capable of detecting the emitted light from said scintillator array;
    an optical light guide that is in juxtaposition to and disposed between said scintillator array and said array detector, wherein said optical light guide comprising a conduit having a first open end, a second open end, and a middle section, wherein said second open end of said conduit is located opposite of said first open end of said conduit, and wherein said middle section of said conduit is disposed between and in communication with said first open end of said conduit and said second open end of said conduit, and wherein said conduit has a translucent or transparent top extending for at least a portion of the length of said conduit forming a first optical window, and wherein said conduit has a translucent or transparent bottom extending for at least a portion of the length of said conduit forming a second optical window, and wherein a passageway is established between said first open end of said conduit, said middle section of said conduit, and said second open end of said conduit, and wherein at least a portion of said translucent or transparent top of said conduit is in alignment above at least a portion of said translucent or transparent bottom of said conduit such that the light emitted by said scintillator array is capable of passing through said second optical window, said passageway of said middle section of said conduit, and said first optical window for detection by said array detector;
    a fluid medium circulation conduit having (i) a first tube member having a first open end, a second open end, and a middle section, wherein said second open end of said first tube member is located opposite of said first open end of said first tube member, and wherein said middle section of said first tube member is disposed between and in communication with said first open end of said first tube member and said second open end of said first tube member, and wherein said first open end of said first tube member is in sealed engagement and communication with said first open end of said conduit of said optical light guide, and wherein said second open end of said first tube member is in sealed engagement and communication with said second open end of said conduit of said optical light for forming a fluid medium circuit passageway between said conduit of said optical light guide and said first tube member of said fluid medium circulation conduit; and
    at least one temperature control element that is in communication with said fluid medium circuit passageway.

2. The device of claim 1 wherein said fluid medium circuit passageway includes at least one fluid medium movement device for effecting the movement of a fluid medium through said conduit of said optical light guide and said fluid medium circulation conduit.

3. The device of claim 2 wherein said fluid medium movement device is a pump that is capable of adjusting the rate and volume of said fluid medium passing through said fluid medium circuit passageway.

4. The device of claim 1 wherein said scintillator array is a silicon photomultiplier.

5. The device of claim 1 wherein said temperature control element is capable of lowering and stabilizing the temperature of said fluid medium passing through said fluid medium circuit passageway.

6. The device of claim 1 that is capable of cooling said emitted light delivered to said array detector.

7. The device of claim 1 that is capable of increasing a signal to noise ratio performance of said scintillator array and said array detector.

8. The device of claim 1 that is capable of stabilizing the temperature of said detected light emitted from said scintillator array.

9. The device of claim 1 including wherein said fluid medium is a mixture of ethylene glycol and water.

10. The device of claim 1 including a reservoir in sealed engagement and communication with said fluid medium circuit passageway.

11. An optical light guide comprising:
a conduit having a first open end, a second open end, and a middle section, wherein said second open end of said conduit is located opposite of said first open end of said conduit, and wherein said middle section of said conduit is disposed between and in communication with said first open end of said conduit and said second open end of said conduit, and wherein said conduit has a translucent or transparent top extending for at least a portion of the length of said conduit forming a first optical window, and wherein said conduit has a translucent or transparent bottom extending for at least a portion of the length of said conduit forming a second optical window, and wherein a passageway is established between said first open end of said conduit, said middle section of said conduit, and said second open end of said conduit, and wherein at least a portion of said translucent or transparent top of said conduit is in alignment above at least a portion of said translucent or transparent bottom of said conduit including wherein said passageway is capable of receiving an influx of a temperature controlled fluid medium at said first open end of said conduit, and wherein said temperature controlled fluid medium is capable of passing through said passageway and forming an effluent stream of said temperature controlled fluid medium at said second open end of said conduit.

12. An optical light guide comprising:
a conduit having a first open end, a second open end, and a middle section, wherein said second open end of said conduit is located opposite of said first open end of said conduit, and wherein said middle section of said conduit is disposed between and in communication with said first open end of said conduit and said second open end of said conduit, and wherein said conduit has a translucent or transparent top extending for at least a portion of the length of said conduit forming a first optical window, and wherein said conduit has a translucent or transparent bottom extending for at least a portion of the length of said conduit forming a second optical window, and wherein a passageway is established between said first open end of said conduit, said middle section of said conduit, and said second open end of said conduit, and wherein at least a portion of said translucent or transparent top of said conduit is in alignment above at least a portion of said translucent or transparent bottom of said conduit including wherein said passageway is capable of receiving an influx of a temperature controlled fluid medium at said second open end of said conduit, and wherein said temperature controlled fluid medium is capable of passing through said passageway and forming an effluent stream of temperature controlled fluid medium at said first open end of said conduit.

13. An optical light guide comprising:
a conduit having a first open end, a second open end, and a middle section, wherein said second open end of said conduit is located opposite of said first open end of said conduit, and wherein said middle section of said conduit is disposed between and in communication with said first open end of said conduit and said second open end of said conduit, and wherein said conduit has a translucent or transparent top extending for at least a portion of the length of said conduit forming a first optical window, and wherein said conduit has a translucent or transparent bottom extending for at least a portion of the length of said conduit forming a second optical window, and wherein a passageway is established between said first open end of said conduit, said middle section of said conduit, and said second open end of said conduit, and wherein at least a portion of said translucent or transparent top of said conduit is in alignment above at least a portion of said translucent or transparent bottom of said conduit including a fluid medium circulation conduit comprising (i) a first tube member having a first open end, a second open end, and a middle section, wherein said second open end of said first tube member is located opposite of said first open end of said first tube member, and wherein said middle section of said first tube member is disposed between and in communication with said first open end of said first tube member and said second open end of said first tube member, and wherein said first open end of said first tube member is in sealed engagement and communication with said first open end of said conduit of said optical light guide, and wherein said second open end of said first tube member is in sealed engagement and communication with said second open end of said conduit of said optical light guide for forming a fluid medium circuit passageway between said conduit of said optical light guide and said first tube member of said fluid medium circulation conduit.

14. The optical light guide of claim 13 including at least one temperature control element that is in communication with said fluid medium circuit passageway.

15. The optical light guide of claim 14 wherein said temperature control element is capable of lowering and stabilizing the temperature of said fluid medium passing through said fluid medium circuit passageway.

16. The optical light guide of claim 13 including wherein said fluid medium circuit passageway includes at least one fluid medium movement device for effecting the movement of a fluid medium through said conduit of said optical light guide and said fluid medium circulation conduit.

17. The optical light guide of claim 16 wherein said fluid medium movement device is a pump that is capable of adjusting the rate and volume of said fluid medium passing through said fluid medium circuit passageway.

18. An optical light guide comprising:
a conduit having a first open end, a second open end, and a middle section, wherein said second open end of said conduit is located opposite of said first open end of said conduit, and wherein said middle section of said conduit is disposed between and in communication with said first open end of said conduit and said second open end of said conduit, and wherein said conduit has a translucent or transparent top extending for at least a portion of the length of said conduit forming a first optical window, and wherein said conduit has a translucent or transparent bottom extending for at least a portion of the length of said conduit forming a second optical window, and wherein a passageway is established between said first open end of said conduit, said middle section of said conduit, and said second open end of said conduit, and wherein at least a portion of said translucent or transparent top of said conduit is in alignment above at least a portion of said translucent or transparent bottom of said conduit including a tapered light guide, wherein said tapered light guide minimizes the effects of a SiPM edge effect on a response of said detector.

19. The optical light guide of claim 18 including one or more SiPMs.

20. A method of temperature stabilization for photomultiplier-based devices comprising:
providing a photomultiplier device comprising an imaging detection module having a scintillator array capable of emitting light and an array detector capable of detecting the emitted light from said scintillator array;

providing an optical light guide that is in juxtaposition to and disposed between said scintillator array and said array detector, wherein said optical light guide comprising a conduit having a first open end, a second open end, and a middle section, wherein said second open end of said conduit is located opposite of said first open end of said conduit, and wherein said middle section of said conduit is disposed between and in communication with said first open end of said conduit and said second open end of said conduit, and wherein said conduit has a translucent or transparent top extending for at least a portion of the length of said conduit forming a first optical window, and wherein said conduit has a translucent or transparent bottom extending for at least a portion of the length of said conduit forming a second optical window, and wherein a passageway is established between said first open end of said conduit, said middle section of said conduit, and said second open end of said conduit, and wherein at least a portion of said translucent or transparent top of said conduit is in alignment above at least a portion of said translucent or transparent bottom of said conduit such that the light emitted by said scintillator array is capable of passing through said second optical window, said passageway of said middle section of said conduit, and said first optical window for detection by said array detector;

providing a fluid medium circulation conduit having (i) a first tube member having a first open end, a second open end, and a middle section, wherein said second open end of said first tube member is located opposite of said first open end of said first tube member, and wherein said middle section of said first tube member is disposed between and in communication with said first open end of said first tube member and said second open end of said first tube member, and wherein said first open end of said first tube member is in sealed engagement and communication with said first open end of said conduit of said optical light guide, and wherein said second open end of said first tube member is in sealed engagement and communication with said second open end of said conduit of said optical light for forming a fluid medium circuit passageway between said conduit of said optical light guide and said first tube member of said fluid medium circulation conduit;

providing at least one temperature control element that is in communication with said fluid medium circuit passageway;

providing at least one fluid medium movement device in communication with said fluid medium circuit passageway;

effecting the movement of a fluid medium through said conduit of said optical light guide and said fluid medium circulation conduit of said fluid medium circuit passageway;

operating said scintillator array to emit light;

passing said scintillator array emitted light (i) through said second optical window of said optical light guide and into said passageway of said conduit of said optical light guide, and (ii) through said fluid medium moving along said passageway of said conduit of said optical light guide, and (iii) through said first optical window of said optical light guide to said array detector; and establishing temperature stabilization of said photomultiplier device resulting from said passage of said emitted light through said moving fluid medium within said conduit of said optical light guide.

21. The method of temperature stabilization of claim 20 including wherein said fluid medium movement device is a pump for adjusting the rate and volume of said fluid medium passing through said fluid medium circuit passageway.

22. The method of temperature stabilization of claim 20 wherein said photomultiplier device is a silicon photomultiplier or a vacuum photomultiplier tube.

23. The method of temperature stabilization of claim 20 including adjusting a thermostat of said temperature control element for providing cooled fluid medium for circulation through said fluid medium circuit passageway and said passageway of said conduit of said optical light guide.

24. The method of temperature stabilization of claim 23 including passing said emitted light of said scintillator array through said second optical window of said optical light guide and through said cooled fluid medium located in said passageway of said conduit of said optical light guide.

25. The method of temperature stabilization of claim 24 including increasing a signal to noise ratio performance of said scintillator array and said array detector.

26. The method of temperature stabilization of claim 24 including providing said fluid medium that is a mixture of ethylene glycol and water.

27. The method of temperature stabilization of claim 20 including storing said fluid medium in a reservoir that is in sealed engagement and communication with said fluid medium circuit passageway.

* * * * *